US012417932B2

United States Patent
Li (10) Patent No.: US 12,417,932 B2
(45) Date of Patent: Sep. 16, 2025

(54) SEMICONDUCTOR APPARATUS AND HEATING DEVICE IN SEMICONDUCTOR APPARATUS

(71) Applicant: BEIJING NAURA MICROELECTRONICS EQUIPMENT CO., LTD., Beijing (CN)

(72) Inventor: Bing Li, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 229 days.

(21) Appl. No.: 17/916,580

(22) PCT Filed: Apr. 1, 2021

(86) PCT No.: PCT/CN2021/084863
§ 371 (c)(1),
(2) Date: Oct. 2, 2022

(87) PCT Pub. No.: WO2021/204051
PCT Pub. Date: Oct. 14, 2021

(65) Prior Publication Data
US 2023/0143413 A1    May 11, 2023

(30) Foreign Application Priority Data

Apr. 10, 2020   (CN) .......................... 202010281032.9

(51) Int. Cl.
*H01L 21/67*      (2006.01)
*F28F 3/12*       (2006.01)
(52) U.S. Cl.
CPC .......... *H01L 21/67103* (2013.01); *F28F 3/12* (2013.01)

(58) Field of Classification Search
CPC .................................................. H01L 21/67103
See application file for complete search history.

(56) References Cited

U.S. PATENT DOCUMENTS

| 6,072,163 A | 6/2000 | Armstrong et al. |
| 6,081,414 A * | 6/2000 | Flanigan ........... H01J 37/32532 279/128 |

(Continued)

FOREIGN PATENT DOCUMENTS

| CN | 1297670 A | 5/2001 |
| CN | 1591774 A | 3/2005 |

(Continued)

OTHER PUBLICATIONS

The World Intellectual Property Organization (WIPO) International Search Report for PCT/CN2021/084863 Jun. 21, 2021 7 Pages (including translation).

*Primary Examiner* — Paul Alvare
(74) *Attorney, Agent, or Firm* — ANOVA LAW GROUP, PLLC (57) ABSTRACT

The present disclosure discloses a heating device in a semiconductor apparatus and the semiconductor apparatus, including a heating body configured to carry a wafer, a heating member configured to generate heat being arranged in the heating body; and a cooling structure, which is arranged on the heating body below, and a cooling structure being arranged below the heating body. The cooling structure is configured to perform heat exchange with the heating body selectively at different positions away from the heating body. The heating device in the semiconductor apparatus and the semiconductor apparatus of the present disclosure are configured to expand an application temperature range of the heating device to satisfy different temperature requirements.

16 Claims, 3 Drawing Sheets

(56) References Cited

U.S. PATENT DOCUMENTS

| | | | |
|---|---|---|---|
| 6,771,086 B2* | 8/2004 | Lutz | G01R 31/2891 324/750.09 |
| 8,390,980 B2* | 3/2013 | Sansoni | H01L 21/6833 361/234 |
| 2001/0040029 A1* | 11/2001 | Davenport | C23C 14/564 228/175 |
| 2002/0129475 A1* | 9/2002 | Tsai | C23C 16/4586 29/25.01 |
| 2002/0186967 A1* | 12/2002 | Ramanan | H01L 21/67109 219/390 |
| 2003/0051665 A1* | 3/2003 | Zhao | C23C 16/5096 712/42 |
| 2003/0155939 A1* | 8/2003 | Lutz | G01R 31/2865 324/750.09 |
| 2004/0097088 A1* | 5/2004 | Kitayama | H01L 21/67109 156/345.1 |
| 2005/0170651 A1 | 8/2005 | Shinma et al. | |
| 2008/0190909 A1* | 8/2008 | Yokouchi | F27D 5/0037 219/385 |
| 2010/0039747 A1* | 2/2010 | Sansoni | H01L 21/67103 361/234 |
| 2011/0159211 A1* | 6/2011 | Du Bois | C23C 14/04 118/71 |
| 2011/0220609 A1* | 9/2011 | Yaegashi | H01L 21/31116 156/345.43 |
| 2012/0285658 A1* | 11/2012 | Roy | H01L 21/68785 165/47 |
| 2015/0170952 A1* | 6/2015 | Subramani | H01J 37/32091 361/234 |
| 2015/0371881 A1* | 12/2015 | Du Bois | H01L 21/68792 374/166 |
| 2018/0155838 A1* | 6/2018 | Rasheed | H01L 21/68785 |
| 2018/0211862 A1* | 7/2018 | Konkola | C23C 16/45544 |
| 2018/0218886 A1* | 8/2018 | Yamaguchi | H01L 21/67069 |
| 2019/0062904 A1* | 2/2019 | Hawrylchak | C23C 16/0227 |
| 2019/0067006 A1* | 2/2019 | Hawrylchak | H01J 37/32724 |
| 2019/0390326 A1* | 12/2019 | Takei | H01L 21/68785 |
| 2020/0095671 A1* | 3/2020 | Chang | C23C 16/4586 |
| 2020/0286755 A1* | 9/2020 | Ito | H01L 21/67103 |
| 2020/0350195 A1* | 11/2020 | West | H01L 21/68785 |
| 2021/0082730 A1* | 3/2021 | Sarode Vishwanath | H01L 21/6833 |
| 2021/0249284 A1* | 8/2021 | Prasad | C23C 16/46 |
| 2022/0076981 A1* | 3/2022 | Shirahatti | H01L 21/67213 |

FOREIGN PATENT DOCUMENTS

| | | | | |
|---|---|---|---|---|
| CN | 106567042 A | 4/2017 | | |
| CN | 108987323 A | 12/2018 | | |
| CN | 110875167 A | 3/2020 | | |
| CN | 111477569 A | 7/2020 | | |
| EP | 3477691 A1 * | 5/2019 | | H01J 37/32715 |
| JP | 2005015820 A | 1/2005 | | |
| JP | 2005150506 A | 6/2005 | | |
| JP | 2018006768 A | 1/2018 | | |
| JP | 2019075219 A | 5/2019 | | |
| KR | 100549231 B1 | 2/2006 | | |
| KR | 20180090204 A | 8/2018 | | |
| KR | 20180135040 A | 12/2018 | | |
| TW | 201304087 A1 | 1/2013 | | |
| TW | 201442143 A | 11/2014 | | |
| TW | 201606919 A | 2/2016 | | |
| TW | 201713789 A | 4/2017 | | |

* cited by examiner

SEMICONDUCTOR APPARATUS AND HEATING DEVICE IN SEMICONDUCTOR APPARATUS

CROSS-REFERENCES TO RELATED APPLICATIONS

This application is a national phase entry under 35 U.S.C. § 371 of International Application No. PCT/CN2021/084863, filed on Apr. 1, 2021, which claims priority to Chinese Application No. 202010281032.9 filed on Apr. 10, 2020, the entire content of all of which are incorporated herein by reference.

TECHNICAL FIELD

The present disclosure generally relates to the field of semiconductor apparatus and, more particularly, to a heating device in a semiconductor apparatus and a semiconductor apparatus.

BACKGROUND

With the continuous development of the semiconductor industry, semiconductor processing is more diverse. However, no matter what kind of process, temperature is an important part of it. Temperature of the process directly affects the apparatus capacity and cost. Generally, a wafer is placed on a heater of a process chamber for processing. During this process, the temperature of the heater is required to remain unchanged. Currently, a method of simultaneously controlling heating and cooling is usually used to keep the temperature unchanged.

However, in a physical vapor deposition (PVD) process, the temperature is difficult to be kept unchanged, because the PVD process is to deposit a sputtered target material onto the wafer by a sputtering deposition technology. Since the temperature of the sputtered target material is high, the target material may transfer its own heat through the wafer to the heater that carries the wafer during deposition. Thus, the surface temperature of the heater increases. As process time increases, the surface temperature of the heater gets higher and higher. Although the heater can be cooled by a cooling device arranged under the heater, the following problems may be caused.

Since heat exchange efficiency of the cooling device is fixed, if heat dissipated by the cooling device is more than the heat generated by the heater, the temperature of the heater cannot be maintained at a relatively high temperature. If the heat dissipated by the cooling device is less than the heat increased by the heater, the temperature of the heater cannot be maintained at a relatively low temperature. Thus, the cooling device may limit a temperature application range of the heater, which cannot satisfy temperature requirements.

SUMMARY

The purpose of the present disclosure is to provide a heating device in a semiconductor apparatus and the semiconductor apparatus to expand the application temperature range of the heating device to satisfy different temperature requirements.

To achieve the above object, embodiments of the present disclosure provide a heating apparatus in a semiconductor apparatus, which is arranged in a process chamber of the semiconductor apparatus and includes:

a heating body configured to carry a wafer, a heating member configured to generate heat being arranged in the heating body; and a cooling structure arranged below the heating body, the cooling structure being configured to selectively perform heat exchange with the heating body at different positions away from the heating body.

In some embodiments, the cooling structure includes:

a cooling body, a cooling member configured to perform heat exchange with the heating body being arranged in the cooling body; and a cooling ascending and descending assembly connected to the cooling body and configured to drive the cooling body to ascend and descend to adjust a distance between the cooling body and the heating body in a vertical direction.

In some embodiments, the heating device further includes a connection member and a sealing structure, wherein:

the connection member is connected to the heating body, the connection member and the heating body form accommodation space at a bottom of the heating body, the cooling body is located in the accommodation space, and the cooling ascending and descending assembly is extended to outside of the process chamber passing through a through-hole arranged at a bottom of the process chamber; and an upper end of the sealing structure is sealed with and connected to the connection member, and a lower end of the sealing structure is sealed with and connected to the bottom of the process chamber to seal the accommodation space and the through-hole.

In some embodiments, the sealing structure includes a bellows and a bellows shaft, wherein:

an upper end of the bellows shaft is connected to the connection member, and a lower end of the bellows shaft is extended to the outside of the process chamber passing through the through-hole to be connected to an ascending and descending drive source; and the bellows is sleeved at the bellows shaft, an upper end of the bellows is sealed with and connected to the connection member, and a lower end of the bellows is sealed with and connected to the bottom of the process chamber to seal the accommodation space and the through-hole.

In some embodiments, the cooling ascending and descending assembly includes a lift member, at least one screw, and at least one elastic member, wherein hollow space communicating with the accommodation space is arranged in the bellows shaft, the lift member is located in the hollow space, and an upper end of the lift member is connected to the cooling body;

at least one threaded hole is arranged at a bottom surface of the lift member, at least one mounting hole is arranged at an inner surface of the bellows shaft opposite to the bottom surface of the lift member, and the mounting hole is coaxially arranged with the threaded hole in a one-to-one correspondence;

the screw is threadedly connected to the corresponding threaded hole passing through the mounting hole from the bottom of the bellows shaft to a top in a one-to-one correspondence; and the elastic member is arranged in a one-to-one correspondence with the screw, is located between the bottom surface of the lift member and the inner surface of the bellows shaft, and is in a compressed state.

In some embodiments, lead-out space and two first lead-out through-holes communicating with the lead-out space are arranged in the lift member, two second lead-out through-holes communicating with the hollow space are arranged in the bellows shaft, and the two second lead-out through-holes are coaxially arranged with the two first lead-out through-holes; and the cooling member further includes a cooling pipeline configured to transfer cooling water, a water inlet pipeline, and a water outlet pipeline, an end of the water inlet pipeline and an end of the water outlet pipeline are connected to an inlet and an outlet of the cooling pipeline, respectively, and the other end of the water inlet pipeline and the other end of the water outlet pipeline are extended the outside of the process chamber passing through the corresponding first lead-out through-hole and the second lead-out through-hole in sequence.

In some embodiments, the cooling structure includes a plurality of cooling bodies, the plurality of cooling bodies being arranged at intervals in a direction away from a bottom surface of the heating body, and a cooling member configured to perform heat exchange with the heating body being arranged in each of the cooling bodies.

In some embodiments, the heating device further includes a connection member and a sealing structure, wherein:

the connection member is connected to the heating body, the connection member forms accommodation space with the heating body at a bottom of the heating body, and the plurality of cooling bodies are located in the accommodation space, wherein each of the cooling members includes a cooling pipeline configured to transfer cooling water, a water inlet pipeline, and a water outlet pipeline, an end of the water inlet pipeline and an end of the water outlet pipeline are connected to an inlet and an outlet of the cooling pipeline, respectively, and the other end of the water inlet pipeline and the other end of the water outlet pipeline are extended to the outside of the process chamber passing through the through-hole arranged at the bottom of the process chamber; and an upper end of the sealing structure is sealed with and connected to the connection member, and a lower end of the sealing structure is sealed with and connected to the bottom of the process chamber to seal the accommodation space and the through-hole.

In some embodiments, the sealing structure includes a bellows and a bellows shaft, wherein:

an upper end of the bellows is connected to the connection member, a lower end of the bellows shaft is extended to the outside of the process chamber passing through the through-hole to be connected to an ascending and descending drive source, the bellows shaft is provided with hollow space communicating with the accommodation space and a plurality of pairs of lead-out through-holes communicating with the hollow space, and the other end of the water inlet pipeline and the other end of the water outlet pipeline are extended to the outside of the process chamber through a pair of corresponding lead-out through-holes; and the bellows is sleeved at the bellows shaft, an upper end of the bellows is sealed with and connected to the connection member, and a lower end of the bellows is sealed with and connected to the bottom of the process chamber to seal the accommodation space and the through-hole.

In some embodiments, an upper surface of a most upper cooling body is attached to an upper surface of the heating body.

In some embodiments, a lower surface of the heating body is parallel to an upper surface of the cooling body.

In some embodiments, the heating device further includes a heat exchange gas inlet pipeline, a gas outlet end of the heat exchange gas inlet pipeline is communicated with the accommodation space, and a gas inlet end of the heat exchange gas inlet pipeline is configured to be connected to a heat exchange gas source.

As another technical solution, embodiments of the present disclosure further provide a semiconductor apparatus, including a process chamber, and further including the heating device of embodiments of the present disclosure, and the heating device is arranged in the process chamber.

The beneficial effects of the present disclosure include as follows.

The heating device in the semiconductor apparatus provided by embodiments of the present disclosure may perform heat exchange with the heating body selectively at different positions away from the heating body through the cooling structure arranged below the heating body. Thus, the cooling structure may cool the heating body with different heat exchange efficiencies. Thus, the heat exchange may be performed at a position close to the heating body to control the temperature of the heating body in a relatively low-temperature range, and heat exchange may be performed at a position far away from the heating body to control the temperature of the heating body in a relatively high-temperature range to further expand the application temperature range of the heating device to satisfy different temperature requirements.

In the semiconductor apparatus provided by embodiments of the present disclosure, by using the above-mentioned heating device provided by embodiments of the present disclosure, the application temperature range of the heating device may be expanded to satisfy different temperature requirements.

The present disclosure may have other features and advantages. These features and advantages are obvious from the accompanying drawings combined in the specification and the subsequent specific embodiments or are described in detail in the accompanying drawings combined in the specification and the subsequent specific embodiments. These accompanying drawings and specific embodiments are used to explain the specific principle of the present disclosure.

BRIEF DESCRIPTION OF THE DRAWINGS

The above and other objects, features, and advantages of the present disclosure will become more apparent by performing a more detailed description of exemplary embodiments of the present disclosure in connection with the accompanying drawings. In exemplary embodiments of the present disclosure, same reference numerals generally refer to the same components.

DETAILED DESCRIPTION OF THE EMBODIMENTS

Figure 1:
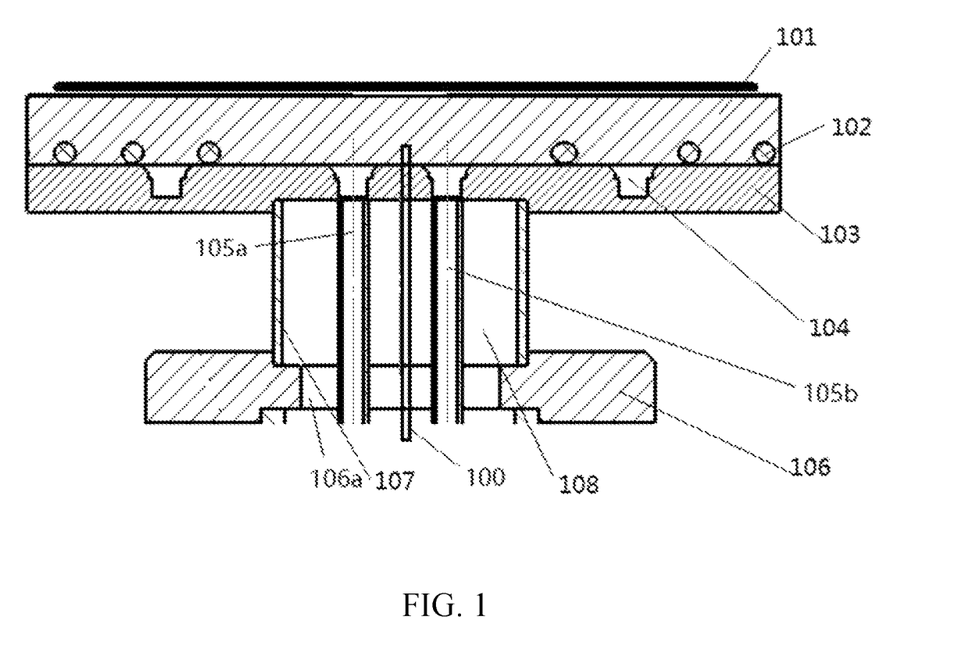
FIG. 1 is a schematic structural diagram of a heating device according to some embodiments of the present disclosure.

FIG. 1 shows a heating device, which is configured to solve a problem that temperature on a surface of the heating device continuously increases. As shown in FIG. 1, the heating device is arranged in a process chamber (not shown in the figure) and includes a heating body 101, a cooling body 103, a heating coil 102, a cooling water channel 104, a water inlet pipeline 105a, a water outlet pipeline 105b, a connection cylinder 107, and a fixing base 106. The heating coil 102 may be arranged in the heating body 101 and configured to generate heat. The cooling water channel 104 may be arranged in the cooling body 103 and configured to exchange heat with the cooling body 103 by transmitting cooling water to indirectly cool the heating body 101. An upper end of the connection cylinder 107 may be sealed with and connected to the cooling body 103. A lower end of the connection cylinder 107 may be sealed with and connected to the fixing base 106. The fixing base 106 may be configured to be fixedly connected to a bottom of the process chamber.

An inlet and an outlet of the cooling water channel 104 may be connected to one end of the water inlet pipeline 105a and one end of the water outlet pipeline 105b, respectively. and the other ends of the water inlet pipeline 105a and the water outlet pipeline 105b may extend outside of the process chamber through internal space 108 of the connection cylinder 107, a through-hole 106a in the fixing base 106, and a through-hole at the bottom of the process chamber (not shown in the figure) in sequence to be connected to a cooling water source. In addition, the heating device may further include a temperature measurement device 100. A detection end of the temperature measurement device 100 may be in contact with the heating body 101. A lead wire end may be led out to the outside of the process chamber through the same path as the above-mentioned water inlet pipeline 105a and water outlet pipeline 105b.

When the above heating device is used, heat generated by the heating coil 102 may be used to maintain a process temperature of the heating body 101. By introducing cooling water into the cooling water channel 104, temperature rise of the heating body 101 caused by the processing process may be lowered. In this process, when the temperature of the heating body 101 is not higher than the process temperature, the heating coil 102 may work. When the temperature of the heating body 101 is higher than the process temperature, cooling water may be introduced into the cooling water channel 104 to maintain the temperature of the heating body 101 at the process temperature.

However, in practical applications, it is found that the above-mentioned heating device can only maintain the temperature of the heating body 101 in a relatively low-temperature range (for example, less than 100° C.). When the required process temperature is higher than this temperature range, since the thermal conductivity of the cooling body 103 is relatively high, after the cooling water is introduced into the cooling water channel 105, the heat of the heating body 101 may be dissipated away quickly. If a speed of dissipating the heat is greater than a speed of generating heat by the heating coil 102 at a full power output, the temperature of the heating body 101 cannot reach a relatively high process temperature. Thus. A high-temperature requirement cannot be satisfied.

Another heating device may be similar to the structure of the above-mentioned heating device shown in FIG. 1. A difference between the two is that a certain gap may be arranged between the upper surface of the cooling body and the lower surface of the heating body, which reduces heat exchange efficiency between the cooling body and the heating body. Thus, the heat of the heating body may not be dissipated greatly to cause the temperature of the heating body to reach a relatively high process temperature. However, in practical applications, it is found that the heating device can only maintain the temperature of the heating body at a relatively high-temperature range (e.g., greater than 80° C.). When the required process temperature is lower than this temperature range, since the heat exchange efficiency of the cooling body is relatively low, a speed of dissipating the heat may be lower than a speed of increasing the heat of the heating body. Therefore, the temperature of the heating body cannot be controlled at a lower process temperature, and the low-temperature requirement cannot be met. In addition, when the apparatus needs to be maintained, the temperature of the heating body may need to be lowered to a normal temperature state to facilitate personnel to perform maintenance. However, since the heat exchange efficiency of the cooling body is low, the time to reduce the heating body to the normal temperature may be too long. Thus, the apparatus maintenance time may be too long, which may affect the apparatus utilization rate.

In order to solve the above problems, the present disclosure provides a heating device in a semiconductor apparatus. The heating device may be arranged in the process chamber of the semiconductor apparatus and include a heating body and a cooling structure. The heating body may be configured to carry a wafer. The heating body that is configured to generate heat may be configured in the heating body. The cooling structure may be arranged below the heating body. The cooling structure may be configured to selectively perform heat exchange with the heating body at different positions from the heating body.

The cooling structure may perform the heat exchange with the heating body at different positions from the heating body in a plurality of manners. For example, an overall height of the above-mentioned cooling structure may be adjusted to change the overall position of the cooling structure from the heating body. For another example, the overall height of the above cooling structure may remain unchanged, and the heat exchange efficiency may be changed only by selecting the cooling components (the components that perform heat exchange with the heating body) at different positions in the cooling structure to work.

By selectively exchanging heat with the heating body at different positions away from the heating body by the cooling structure, the cooling structure may cool the heating body with different heat exchange efficiencies. Thus, heat may be exchanged with the heating body at a position close to the heating body to control the temperature of the heating body in a low-temperature range, and heat may be exchanged with the heating body at a position far away from the heating body to control the temperature of the heating body in a high-temperature range. Thus, an application temperature range of the heating device may be expanded, which satisfies the high-temperature requirement and also the low-temperature requirement.

The present disclosure may be further described in detail below with reference to the accompanying drawings and specific embodiments.

Embodiment 1

Figure 2:
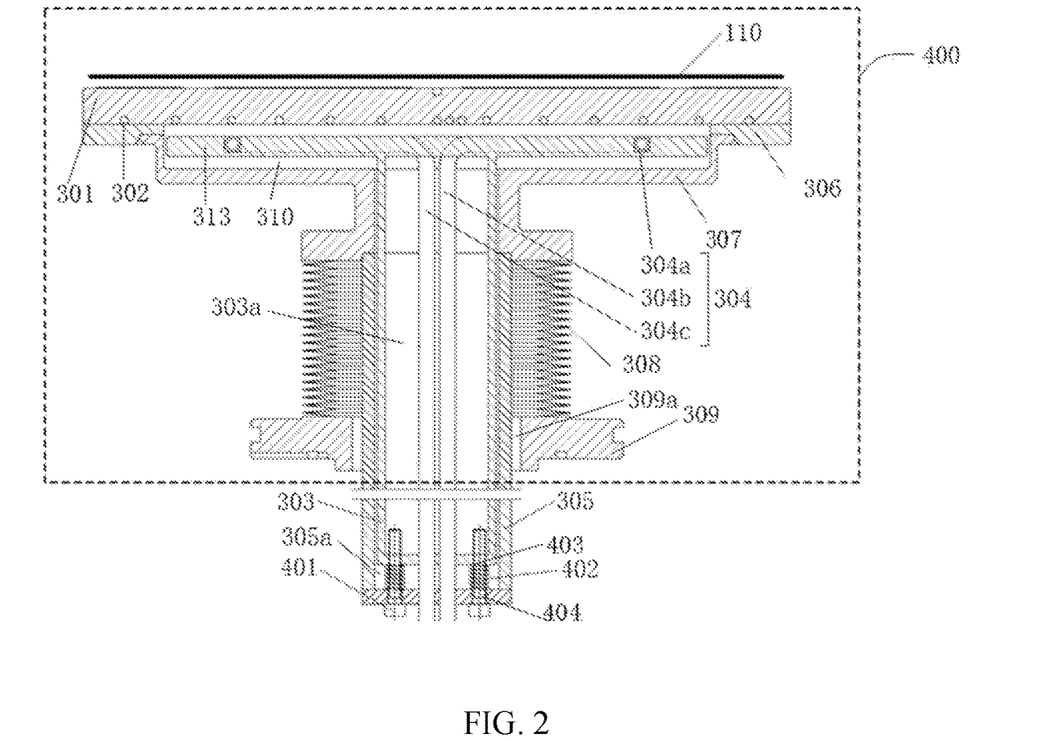
FIG. 2 is a schematic structural diagram of a heating device of a semiconductor apparatus according to Embodiment 1 of the present disclosure.

With reference to FIG. 2, Embodiment 1 of the present disclosure provides a heating device in a semiconductor apparatus. The heating device includes a heating body 301 and a cooling structure. The heating body 301 may be configured to carry a wafer 110. For example, the wafer 110 may be placed on an upper surface of the heating body 301. The heating body 301 may be in a circular plate shape. Of course, another arbitrary shape may also be used according to specific needs. Moreover, a heating member 302 configured to generate heat may be arranged in the heating body 301. The heating member 302 may include a heating element capable of generating heat, such as a heating resistance wire, a heating lamp, etc. Specifically, the heating member 302 shown in FIG. 2 is a heating resistance wire, which is embedded in the heating body 301 from the lower surface of the heating body 301 and evenly distributed relative to the lower surface of the heating body 301. Thus, the wafer 110 may be uniformly heated.

The cooling structure may be arranged below the heating body 301. The cooling structure may include a cooling body 313 and a cooling lift assembly. A cooling member 304 configured to perform heat exchange with the heating body 301 may be arranged in the cooling body 313. The cooling lift assembly may be connected to the cooling body 313 and configured to drive the cooling body 313 to ascend and descend to adjust a distance between the cooling body 313 and the heating body 301 in a vertical direction. That is, driven by the cooling lift assembly, an overall height of the cooling body 313 may change to adjust the position of the cooling member 304 of the cooling body 313 away from the heating body 301. The closer the cooling member 304 to the heating body 301 is, the higher the heat exchange efficiency with the heating body 301 is, and the easier the temperature of the heating body 301 may be maintained at a low temperature. Thus, the low-temperature requirement may be satisfied. Otherwise, the further the cooling member 304 away from the heating body 301 is, the higher the heat exchange efficiency of the heating body 301 is, and the easier the temperature of the heating body 301 may be maintained at a high temperature, which satisfies the high-temperature requirement. Thus, the application temperature range of the heating device may be expanded, which satisfies different temperature needs. In addition, with the above-mentioned cooling lift assembly, the overall height of the cooling body 313 may be adjusted freely. Thus, the flexibility of temperature adjustment may be improved.

In some embodiments, a lower end of the cooling lift assembly may need to be extended to the outside of the process chamber. In this case, in order to ensure the tightness of the process chamber. In some embodiments, the heating device may further include a connection member 307 and a seal structure. The connection member 307 may be connected to the heating body 301. The connection member 307 may form accommodation space 310 with the heating body 301 at the bottom of the heating body 301. The cooling body 313 may be located in the accommodation space 310. The cooling lift assembly may be extended to the outside of the process chamber 400 passing through the through-hole arranged at the bottom (not shown) of the process chamber 400. The upper end of the seal structure may be sealed and connected to the bottom of the process chamber 400. The seal structure may be configured to seal the accommodation space 310 and the through-hole. An internal part of a dashed line block may represent an internal part of the process chamber 400. An outer part of the dashed line block may represent outside of the process chamber.

In some embodiments, in order to facilitate disassembly and assembly, and to protect the heating body 301 from being damaged during disassembly and assembly, the connection member 307 may be fixed at the bottom of the heating body 301 through an annular connection piece 306. The annular connection piece 306 may be sealed with and connected to the heating body 301 and the connection member 307, respectively. In this case, the above-mentioned annular connection piece 306, the connection member 307, and the heating body 301 may form the above-mentioned accommodation space 310. Various sealing and connection manners may be included, for example, welding, or threaded connection with vacuum sealing treatment. Of course, in practical applications, the connection member 307 may also be directly connected to the heating body 301.

The above sealing structure may include various structures. For example, as shown in FIG. 2, in this embodiment, the sealing structure includes a bellows 308 and a bellows shaft 305. An upper end of the bellows shaft 305 may be connected to the connection member 307, and a lower end of the bellows shaft 305 may extend to the outside of the process chamber 400 by passing through the through-hole and may be configured to be connected to a lift drive source (not shown in the figure). Driven by the lift drive source, the bellows shaft 305 may be configured to drive the heating body 301 to ascend and descend through the connection member 307. Thus, the heating body 301, the connection member 307, and the cooling body 313 may all ascend and descend synchronously. The bellows 308 may be sleeved on the bellows shaft 305. The upper end of the bellows 308 may be sealed with and connected to the connection member 307. The lower end of the bellows 308 may be sealed with and connected to the bottom of the process chamber 400 and configured to seal the accommodation space 310 and the above-mentioned through-hole. Thus, the sealing performance of the process chamber 400 may be ensured.

In some embodiments, the lower end of the above-mentioned bellows 308 may be sealed with and connected to a bottom wall (not shown in the figure) of the process chamber 400 through a fixing base 309. A fixing base through-hole 309 may be arranged in the fixing base 309. The lower end of the bellows shaft 305 may extend to the outside of the process chamber 400 through the fixed base through-hole 309a and the through-hole at the bottom of the process chamber 400 in sequence. It can be understood that the above-mentioned bellows 308 may be also configured to seal the fixing base through-hole 309a.

The above-mentioned cooling lift assembly may include various structures. For example, in this embodiment, the cooling lift assembly may include a lift member 303, at least one screw 401, and at least one elastic member 402. Hollow space 305a that is communicated with the accommodation space 310 may be arranged in the bellows shaft 305. The lift member 303 may be located in the hollow space 305a. An upper end of the lift member 303 may be connected to the above cooling body 313. A connection manner of the lift member 303 and the cooling body 313 may include, for example, an integration manner, a welding manner, etc. At least one threaded hole 403 may be arranged at a bottom surface of the lift member 303. At least mounting hole 404 may be arranged on an inner surface of the bellows shaft 305 opposite to the bottom surface of the lift member 303. The mounting holes 404 may be coaxially arranged with the threaded holes 403 in a one-to-one correspondence. The crews 401 may be threadedly connected to the threaded holes 403 passing through the mounting holes 404 in a one-to-one correspondence from bottom to top. The elastic members 402 may be arranged in a one-to-one correspondence with the screws 401, may be located between the bottom surface of the lift member 303 and the inner surface of the bellows shaft 305, and may be in a compressed state.

In some embodiments, a plurality of screws 401 may be included (two screws 401 are shown in FIG. 2). The plurality of screws 401 may be arranged symmetrically relative to an axis of the bellows shaft 305. By arranging the plurality of screws 401, the stability of supporting the cooling body 313 may be improved.

When the above-mentioned screw 401 is rotated, since the screw is threadedly connected to the threaded hole 403 at the lift member 303. With the thread cooperation, the screw 401 may be fixed. The lift member 303 may ascend or descend along a axial direction of the screw 401 to drive the cooling body 313 to ascend or descend synchronously. Meanwhile, since the elastic member 402 is in the compressed state, the elastic member 402 may always apply an upward elastic force to the lift member 303 to support the lift member 303 and the cooling body 313. The elastic member 402 may include, for example, a compression spring.

It should be noted that the cooling lift assembly may not be limited to the above structure of this embodiment. In practical applications, the cooling lift assembly may further adopt any other structure that can drive the cooling body 313 to ascend and descend.

It should also be noted that, in this embodiment, the heating body 301 may realize ascending and descending using a heating ascending and descending assembly. However, embodiments of the present disclosure may be not limited to this. In practical applications, according to specific needs, the above heating ascending and descending assembly may not be provided. That is, the heating body 301 may be fixed and may not move relative to the process chamber. In this case, if the cooling lift assembly needs to be extended out of the process chamber, a corresponding sealing structure may be used to seal the through-hole at the bottom of the process chamber, which is configured for the cooling lift assembly to pass through to ensure the sealing performance of the process chamber. Of course, the above cooling and lifting assemblies may also be arranged inside the process chamber. In this case, an automatic control method may be used to provide ascending and descending power for the cooling and lifting assemblies.

In this embodiment, lead-out space 303*a* and two first lead-out through-holes communicating with the lead-out space 303*a* may also be arranged in the lifting member 303. Moreover, two second lead-out through-holes communicating with the hollow space 305*a* may be arranged in the bellows shaft 305. The two second lead-out through-holes may be coaxially arranged with the two first lead-out through holes. The above-mentioned cooling member 304 may include a cooling pipeline 304*a* configured to transfer cooling water, a water inlet pipeline 304*b*, and a water outlet pipeline 304*c*. One end of the water inlet pipeline 304*b* and one end of the water outlet pipeline 304*c* may be connected to the inlet and the outlet of the cooling pipeline 304*a*, respectively. The other end of the water inlet pipeline 304*b* and the other end of the water outlet pipeline 304*c* may be extended to the outside of the process chamber 400 through the corresponding first lead-out through-holes and the second lead-out through-holes in sequence to be able to provide a water source connection of the cooling water.

In some embodiments, the above-mentioned cooling pipeline 304*a* may be an annular water pipe or may also be a helical water pipe, which is evenly distributed relative to the upper surface of the cooling body 313 to improve cooling uniformity.

In this embodiment, In some embodiments, the lower surface of the heating body 301 and the upper surface of the cooling body 313 may be parallel to each other. Thus, heat exchange efficiencies between the upper surface of the cooling body 313 at different positions and the heating body 301 can be the same. Thus, the temperature uniformity of the heating body 301 may be improved.

In this embodiment, In some embodiments, the heating device may further include a heat exchange gas input pipeline (not shown in the figure). A gas outlet end of the heat exchange gas input pipeline may be communicated with the above-mentioned accommodation space 310. An inlet end of the heat exchange gas input pipeline may be connected to a heat exchange gas source. By introducing the heat exchange gas to the accommodation space 310, a gas pressure in the accommodation space 310 may be improved, which may further improve the heat exchange efficiency and improves the cooling efficiency. Especially, when the apparatus needs maintenance, time for reducing the heating body to a normal temperature may be shortened, which reduces apparatus maintenance time to improve the apparatus utilization rate. The heat exchange gas may be, for example, compression gas (e.g., high-pressure air).

Embodiment 2

Figure 3:
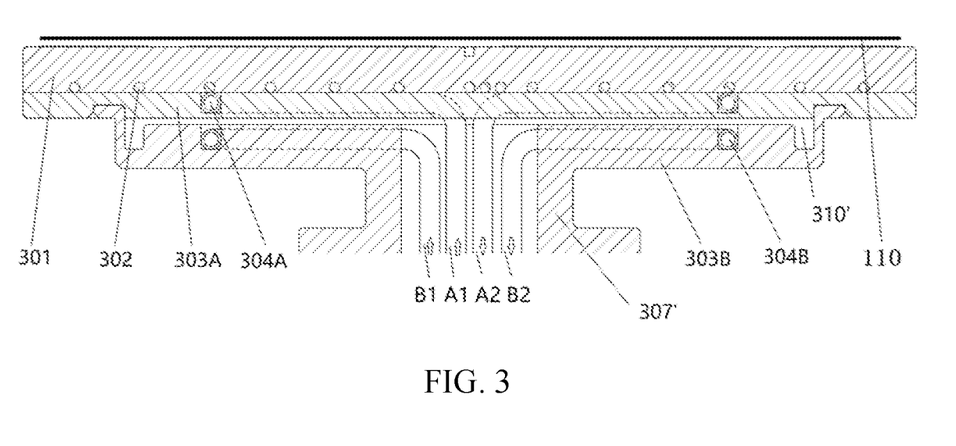
FIG. 3 is a schematic structural diagram of a heating device of a semiconductor apparatus according to Embodiment 2 of the present disclosure.

Referring to FIG. 3, Embodiment 2 of the present disclosure provides a heating device in the semiconductor apparatus. Compared with Embodiment 1 above, the heating device also includes a heating body 301 and a cooling structure. The difference may include that the specific structure of the cooling structure is different.

Specifically, in this embodiment, the cooling structure may include a plurality of cooling bodies. The plurality of cooling bodies may be arranged at intervals along a direction away from the lower surface of the heating body 301. A cooling member configured to perform heat exchange with the heating body 301 may be arranged in each cooling body. Since different cooling members have different positions from the heating body 301, by selectively controlling the cooling member of the at least one cooling body to work, cooling may be performed on the heating body 301 with different heat exchange efficiencies to satisfy different temperature needs. That is, positions of the cooling bodies from the heating body 301 may be unchanged. The heat exchange efficiency may be changed only by selecting the cooling members at the different positions to work.

In some embodiments, the upper surface of the uppermost cooling body may be attached to the upper surface of the heating body 301. Thus, the heat exchange efficiency between the uppermost cooling body and the heating body 301 may be further improved to satisfy the high cooling speed requirement.

For example, FIG. 3 shows two cooling bodies, which are a first cooling body 303A and a second cooling body 303B located below the first cooling body 303A. The second cooling body 303B may be arranged with the first cooling body 303A at an interval. A first cooling member 304A may be arranged in the first cooling member 304A. A second cooling member 304B may be arranged in the second cooling body 304B.

The first cooling member 304A and the second cooling member 304B may operate individually or simultaneously. When the first cooling member 304A and the second cooling member 304B work simultaneously, the heat exchange efficiency may be the highest. Since the first cooling member 304A is closer to the second cooling member 304B because the first cooling part 304A is closer to the heating body 301 than the second cooling member 304B. The heat exchange efficiency of the first cooling member when the first cooling member 304A operates individually may be higher than the heat exchange efficiency of the second cooling member 304B when the second cooling member 304B operates individually. Therefore, by selecting at least one of the first cooling member 304A and the second cooling member 304B, switching may be performed among the three types of the heat exchange efficiencies to satisfy different temperature requirements. It is easy to understand that the greater the number of cooling bodies is, the more choices of the heat exchange efficiency have, and the greater the flexibility of temperature regulation is.

In this embodiment, the heating device may also include a heating ascending and descending assembly configured to drive the heating body 301 to ascend and descend. The heating ascending and descending assembly may adopt a structure similar to the above-mentioned Embodiment 1 (refer to the relevant part of FIG. 2). A difference may include that, as shown in FIG. 3, in this embodiment, an upper end of a connection member 307' is sealed with and connected to the first cooling body 303A and form accommodation space 310' at the bottom of the first cooling body 303A with the first cooling body 303A. The second cooling body 303B may be located in the accommodation space 310' and may be integrated with the connection member 307'. That is, the above-mentioned connection member 307' may be used as the second cooling body 303B. The second cooling member 304B may be arranged n the connection member 307' to seal the process chamber.

The other structures of the heating ascending and descending assembly may be the same as the above-mentioned Embodiment 1. Detailed description may be in the above-mentioned Embodiment 1 and may not be repeated here.

In this embodiment, each cooling member may include a cooling pipeline configured to transfer cooling water, a water inlet pipeline, and a water outlet pipeline. The water inlet pipeline and the water outlet pipeline may be extended to the outside of the process chamber in the same manner as in the above-mentioned Embodiment 1. Taking the first cooling member 304A and the second cooling member 304B shown in FIG. 3 as an example, the water inlet pipeline A1 and the water outlet pipeline A2 in the first cooling part 304A, and the water inlet pipeline B1 and the water outlet pipeline B2 in the second cooling member 304B may all be extended to the outside of the process chamber through the hollow space of the bellows shaft (not shown in the figure).

Other structures of the heating device of Embodiment 2 of the present disclosure are similar to those in Embodiment 1 above. The detailed description is included in the above-mentioned Embodiment 1 and may not be repeated here.

In summary, In the heating device in the semiconductor apparatus provided by embodiments of the present disclosure, through the cooling structure arranged below the heating body, heat exchange may be performed selectively at different positions from the heating body. Thus, the cooling structure may cool the heating body with different heat exchange efficiencies. Therefore, heat exchange may be performed at a position close to the heating body to control the temperature of the heating body to be in a low-temperature range. The heat exchange may be performed at a position far away from the heating body to control the temperature of the heating body to be within the high-temperature range. The application temperature range of the heating device may be expanded to satisfy different temperature requirements.

Another embodiment of the present disclosure further provides a semiconductor apparatus, such as a physical vapor deposition apparatus, including a process chamber and a heating device arranged in the process chamber. The heating device may adopt the heating device provided by the above-mentioned embodiments of the present disclosure.

In the semiconductor apparatus provided by embodiments of the present disclosure, by using the above-mentioned heating device provided by embodiments of the present disclosure, the application temperature range of the heating device may be expanded to satisfy different temperature requirements.

Various embodiments of the present disclosure have been described above. The above descriptions are exemplary, not exhaustive, and not limited to the disclosed embodiments. Modifications and variations made without departing from the scope or spirit of scopes of embodiments of the present disclosure may be apparent to those of ordinary skill in the art.

What is claimed is:

1. A heating device in a semiconductor apparatus arranged in a process chamber of the semiconductor apparatus comprising:
a heating body configured to carry a wafer, a heating member configured to generate heat being arranged in the heating body; and
a cooling structure arranged below the heating body and configured to selectively perform heat exchange with the heating body at different positions away from the heating body, and including:
at least one cooling body, a cooling member configured to perform heat exchange with the heating body being arranged in the at least one cooling body; and
a cooling ascending and descending assembly connected to the at least one cooling body and configured to drive the at least one cooling body to ascend and descend to adjust a distance between the at least one cooling body and the heating body in a vertical direction;
a connection member connected to the heating body, the connection member and the heating body forming accommodation space at a bottom of the heating body, the at least one cooling body being located in the accommodation space, and the cooling ascending and descending assembly being extended to outside of the process chamber passing through a through-hole arranged at a bottom of the process chamber; and
a sealing structure, an upper end of the sealing structure being sealed with and connected to the connection member, and a lower end of the sealing structure being sealed with and connected to the bottom of the process chamber to seal the accommodation space and the through-hole.

2. The heating device according to claim 1, wherein the sealing structure includes:
a bellows shaft, an upper end of the bellows shaft being connected to the connection member, and a lower end of the bellows shaft being extended to the outside of the process chamber passing through the through-hole to be connected to an ascending and descending drive source; and
a bellows sleeved at the bellows shaft, an upper end of the bellows being sealed with and connected to the connection member, and a lower end of the bellows being sealed with and connected to the bottom of the process chamber to seal the accommodation space and the through-hole.

3. The heating device according to claim 2, wherein the cooling ascending and descending assembly further includes:

a lift member located in hollow space, the hollow space communicating with the accommodation space being arranged in the bellows shaft, and an upper end of the lift member being connected to the at least one cooling body;

a screw, a threaded hole being arranged at a bottom surface of the lift member, at least one mounting hole being arranged at an inner surface of the bellows shaft opposite to the bottom surface of the lift member, and the mounting hole being coaxially arranged with the threaded hole in a one-to-one correspondence, the screw being threadedly connected to the corresponding threaded hole passing through the mounting hole from the bottom of the bellows shaft to top in a one-to-one correspondence; and an elastic member arranged in a one-to-one correspondence with the screw, located between the bottom surface of the lift member and the inner surface of the bellows shaft, and being in a compressed state.

4. The heating device according to claim 3, wherein:
lead-out space and two first lead-out through-holes communicating with the lead-out space are arranged in the lift member;
two second lead-out through-holes communicating with the accommodation space are arranged in the bellows shaft, and the two second lead-out through-holes are coaxially arranged with the two first lead-out through-holes;
the cooling member further includes:
   a cooling pipeline configured to transfer cooling water;
   a water inlet pipeline; and
   a water outlet pipeline, an end of the water inlet pipeline and an end of the water outlet pipeline being connected to an inlet and an outlet of the cooling pipeline, respectively, and the other end of the water inlet pipeline and the other end of the water outlet pipeline being extended to the outside of the process chamber passing through the corresponding first lead-out through-hole and the second lead-out through-hole in sequence.

5. The heating device according to claim 1, wherein the at least one cooling body includes:
a plurality of cooling bodies arranged at intervals in a direction away from a bottom surface of the heating body; and
the cooling member configured to perform heat exchange with the heating body and being arranged in each cooling body of the plurality of cooling bodies.

6. The heating device according to claim 5, wherein:
the plurality of cooling bodies is located in the accommodation space, the cooling member including;
   a cooling pipeline configured to transfer cooling water,
   a water inlet pipeline; and
   a water outlet pipeline, an end of the water inlet pipeline and an end of the water outlet pipeline are connected to an inlet and an outlet of the cooling pipeline, respectively, and the other end of the water inlet pipeline and the other end of the water outlet pipeline are extended to the outside of the process chamber passing through a through-hole arranged at the bottom of the process chamber.

7. The heating device according to claim 6, wherein the sealing structure includes:
a bellows shaft, an upper end of the bellows shaft being connected to the connection member, a lower end of the bellows shaft being extended to the outside of the process chamber passing through the through-hole to be connected to an ascending and descending drive source, the bellows shaft being provided with hollow space communicating with the accommodation space and a plurality of pairs of lead-out through-holes communicating with the accommodation space, and the other end of the water inlet pipeline and the other end of the water outlet pipeline being extended to the outside of the process chamber through a pair of corresponding lead-out through-holes; and
a bellows sleeved at the bellows shaft, an upper end of the bellows being sealed with and connected to the connection member, and a lower end of the bellows being sealed with and connected to the bottom of the process chamber to seal the accommodation space and the through-hole.

8. The heating device according to claim 5, wherein an upper surface of a most upper cooling body of the plurality of cooling bodies is attached to a lower surface of the heating body.

9. The heating device according to claim 5, wherein a lower surface of the heating body is parallel to an upper surface of the plurality of cooling bodies.

10. The heating device according to claim 1, further comprising:
a heat exchange gas inlet pipeline, a gas outlet end of the heat exchange gas inlet pipeline being communicated with the accommodation space, and a gas inlet end of the heat exchange gas inlet pipeline being configured to be connected to a heat exchange gas source.

11. A semiconductor apparatus comprising:
a process chamber; and
a heating device arranged in the process chamber and including:
   a heating body configured to carry a wafer, a heating member configured to generate heat and being arranged in the heating body; and
   a cooling structure arranged below the heating body and configured to selectively perform heat exchange with the heating body at different positions away from the heating body, and including:
      at least one cooling body, a cooling member configured to perform heat exchange with the heating body being arranged in the at least one cooling body; and
      a cooling ascending and descending assembly connected to the at least one cooling body and configured to drive the at least one cooling body to ascend and descend to adjust a distance between the at least one cooling body and the heating body in a vertical direction;
   a connection member connected to the heating body, the connection member and the heating body forming accommodation space at a bottom of the heating body, the at least one cooling body being located in the accommodation space, and the cooling ascending and descending assembly being extended to outside of the process chamber passing through a through-hole arranged at a bottom of the process chamber; and
   a sealing structure, an upper end of the sealing structure being sealed with and connected to the connection member, and a lower end of the sealing structure being sealed with and connected to the bottom of the process chamber to seal the accommodation space and the through-hole.

12. The semiconductor apparatus according to claim 1, wherein the sealing structure includes:

a bellows shaft, an upper end of the bellows shaft being connected to the connection member, and a lower end of the bellows shaft being extended to the outside of the process chamber passing through the through-hole to be connected to an ascending and descending drive source; and a bellows sleeved at the bellows shaft, an upper end of the bellows being sealed with and connected to the connection member, and a lower end of the bellows being sealed with and connected to the bottom of the process chamber to seal the accommodation space and the through-hole.

13. The semiconductor apparatus according to claim 12, wherein the cooling ascending and descending assembly further includes:

a lift member located in hollow space, the hollow space communicating with the accommodation space being arranged in the bellows shaft, and an upper end of the lift member being connected to the cooling body;

a screw, a threaded hole being arranged at a bottom surface of the lift member, at least one mounting hole being arranged at an inner surface of the bellows shaft opposite to the bottom surface of the lift member, and the mounting hole being coaxially arranged with the threaded hole in a one-to-one correspondence, the screw being threadedly connected to the corresponding threaded hole passing through the mounting hole from the bottom of the bellows shaft to top in a one-to-one correspondence; and an elastic member arranged in a one-to-one correspondence with the screw, located between the bottom surface of the lift member and the inner surface of the bellows shaft, and being in a compressed state.

14. The semiconductor apparatus according to claim 13, wherein:

lead-out space and two first lead-out through-holes communicating with the lead-out space are arranged in the lift member;

two second lead-out through-holes communicating with the accommodation space are arranged in the bellows shaft, and the two second lead-out through-holes are coaxially arranged with the two first lead-out through-holes;

the cooling member further includes:

a cooling pipeline configured to transfer cooling water;

a water inlet pipeline; and a water outlet pipeline, an end of the water inlet pipeline and an end of the water outlet pipeline being connected to an inlet and an outlet of the cooling pipeline, respectively, and the other end of the water inlet pipeline and the other end of the water outlet pipeline being extended to the outside of the process chamber passing through the corresponding first lead-out through-hole and the second lead-out through-hole in sequence.

15. The semiconductor apparatus according to claim 11, wherein the at least one cooling body includes:

a plurality of cooling bodies arranged at intervals in a direction away from a bottom surface of the heating body; and the cooling member configured to perform heat exchange with the heating body and being arranged in each cooling body of the plurality of cooling bodies.

16. The semiconductor apparatus according to claim 15, wherein:

the plurality of cooling bodies are located in the accommodation space, the cooling member including;

a cooling pipeline configured to transfer cooling water, a water inlet pipeline; and a water outlet pipeline, an end of the water inlet pipeline and an end of the water outlet pipeline are connected to an inlet and an outlet of the cooling pipeline, respectively, and the other end of the water inlet pipeline and the other end of the water outlet pipeline are extended to the outside of the process chamber passing through a through-hole arranged at the bottom of the process chamber.

\* \* \* \* \*